(12) United States Patent
Haglid

(10) Patent No.: US 7,231,967 B2
(45) Date of Patent: Jun. 19, 2007

(54) VENTILATOR SYSTEM AND METHOD

(75) Inventor: Klas C. Haglid, Ridgewood, NJ (US)

(73) Assignee: Building Performance Equipment, Inc., Hillsdale, NJ (US)

( * ) Notice: Subject to any disclaimer, the term of this patent is extended or adjusted under 35 U.S.C. 154(b) by 523 days.

(21) Appl. No.: 10/142,630

(22) Filed: May 10, 2002

(65) Prior Publication Data

US 2002/0164944 A1    Nov. 7, 2002

Related U.S. Application Data

(60) Continuation-in-part of application No. 09/579,739, filed on May 26, 2000, now abandoned, and a continuation-in-part of application No. 09/829,772, filed on Apr. 10, 2001, now Pat. No. 6,983,788, which is a division of application No. 09/188,729, filed on Nov. 9, 1998, now Pat. No. 6,176,305.

(51) Int. Cl.
    *F24F 7/007*    (2006.01)
    *F24F 7/08*    (2006.01)

(52) U.S. Cl. ..................... 165/231; 165/54; 165/248

(58) Field of Classification Search .......... 165/54, 165/248, 231; 236/49.3
See application file for complete search history.

(56) References Cited

U.S. PATENT DOCUMENTS

| | | | |
|---|---|---|---|
| 2,247,542 A | 7/1941 | Anderson | |
| 4,293,027 A | 10/1981 | Tepe et al. | |
| 4,362,026 A * | 12/1982 | Miller | |
| 4,653,574 A | 3/1987 | Quinlisk et al. | |
| 4,820,468 A * | 4/1989 | Hartig | |
| 4,841,738 A | 6/1989 | Katsuki et al. | |
| 5,024,263 A | 6/1991 | Laine et al. | |
| 5,078,208 A | 1/1992 | Urch | |

(Continued)

FOREIGN PATENT DOCUMENTS

DE    3030778    2/1982

(Continued)

OTHER PUBLICATIONS

TAC Xenta Family V3 Engineering Guidelines Published Aug. 1998.

(Continued)

*Primary Examiner*—John K. Ford
(74) *Attorney, Agent, or Firm*—Kramer Levin Naftalis & Frankel; Gregor N. Neff

(57) ABSTRACT

The ventilator system and method use a heat exchanger to selectively transfer heat between fresh outside air entering and exhaust air leaving an enclosed space whenever energy can be recovered from the exhaust air by doing so. The system uses a microprocessor-based controller which stores one or more profiles indicating the time-varying needs of the enclosed space for heating and cooling. The transfer of heat between the exhaust and fresh air is reduced or eliminated simply by reducing the speed of or stopping the exhaust air handler while the fresh air handler continues to run. Evaporative cooling for the exhaust air can be provided, and an all-plastic plate type heat exchanger preferably is used, together with an air handler at the exhaust outlet of the heat exchanger to pull exhaust air through the heat exchanger.

13 Claims, 8 Drawing Sheets

U.S. PATENT DOCUMENTS

| | | | |
|---|---|---|---|
| 5,082,173 A * | 1/1992 | Poehlman et al. ........ 236/44 A |
| 5,119,987 A | 6/1992 | Kobayashi |
| 5,123,595 A | 6/1992 | Doss |
| 5,193,610 A | 3/1993 | Morissette et al. |
| 5,239,834 A | 8/1993 | Travers |
| 5,257,736 A | 11/1993 | Roy |
| 5,348,077 A | 9/1994 | Hillman |
| 5,431,215 A | 7/1995 | Davis |
| 5,497,823 A | 3/1996 | Davis |
| 5,632,334 A | 5/1997 | Grinbergs et al. |
| 5,829,513 A | 11/1998 | Urch |
| 5,902,183 A * | 5/1999 | D'Souza ..................... 454/258 |
| 6,378,317 B1 * | 4/2002 | Ribo ........................ 454/236 |

FOREIGN PATENT DOCUMENTS

| | | |
|---|---|---|
| DE | 3128684 | 2/1983 |
| EP | 01884887 | 6/1986 |
| EP | 0414231 | 2/1991 |
| FR | 2370238 | 6/1978 |
| GB | 2323920 | 10/1998 |
| JP | 56 080644 | 7/1981 |
| JP | 56080644 | 7/1981 |
| JP | 3-211338 | 4/1982 |
| JP | 57 055338 | 4/1982 |
| JP | 0055338 | 4/1982 |
| JP | 61 195224 | 8/1986 |
| JP | 0019634 | 1/1987 |
| JP | 62-242746 * | 10/1987 |
| JP | 1-318820 * | 12/1989 |
| JP | 1318821 | 12/1989 |
| JP | 3-211337 | 8/1991 |
| JP | 4-281143 | 10/1992 |
| JP | 4-13028 | 11/1992 |
| JP | 6-294590 * | 10/1994 |
| JP | 7-190449 | 7/1995 |
| JP | 07190449 A * | 7/1995 |
| JP | 09178243 A * | 7/1997 |
| JP | 11-230600 | 8/1999 |
| JP | 2001193991 A * | 7/2001 |
| SU | 1083033 | 3/1984 |
| WO | WO9622497 | 7/1996 |

OTHER PUBLICATIONS

Interoperable News Summer/Fall 1999.
TAC Xenta 104-A Rooftop Unit Controller Dec. 21, 1998.
Milestones In TAC's History.
TAC Xenta 300/TAC Menta/TAC Vista Manual May 4, 1999.
TAC Xenta OP Handbook Aug. 8, 2000.
TAC Xenta 300 and 401 Handbook Oct. 1, 2000.
Trane Installation/Operation/Maintenance EMTX-10M-5 Dec. 1993.
Trane VanTrac II Central Control Panel Installation Guide Jun. 1995.
"Heat Recovery Ventilators Fresh Air"—brochure—NuTone Co.—Cincinnati, OH, no date.

* cited by examiner

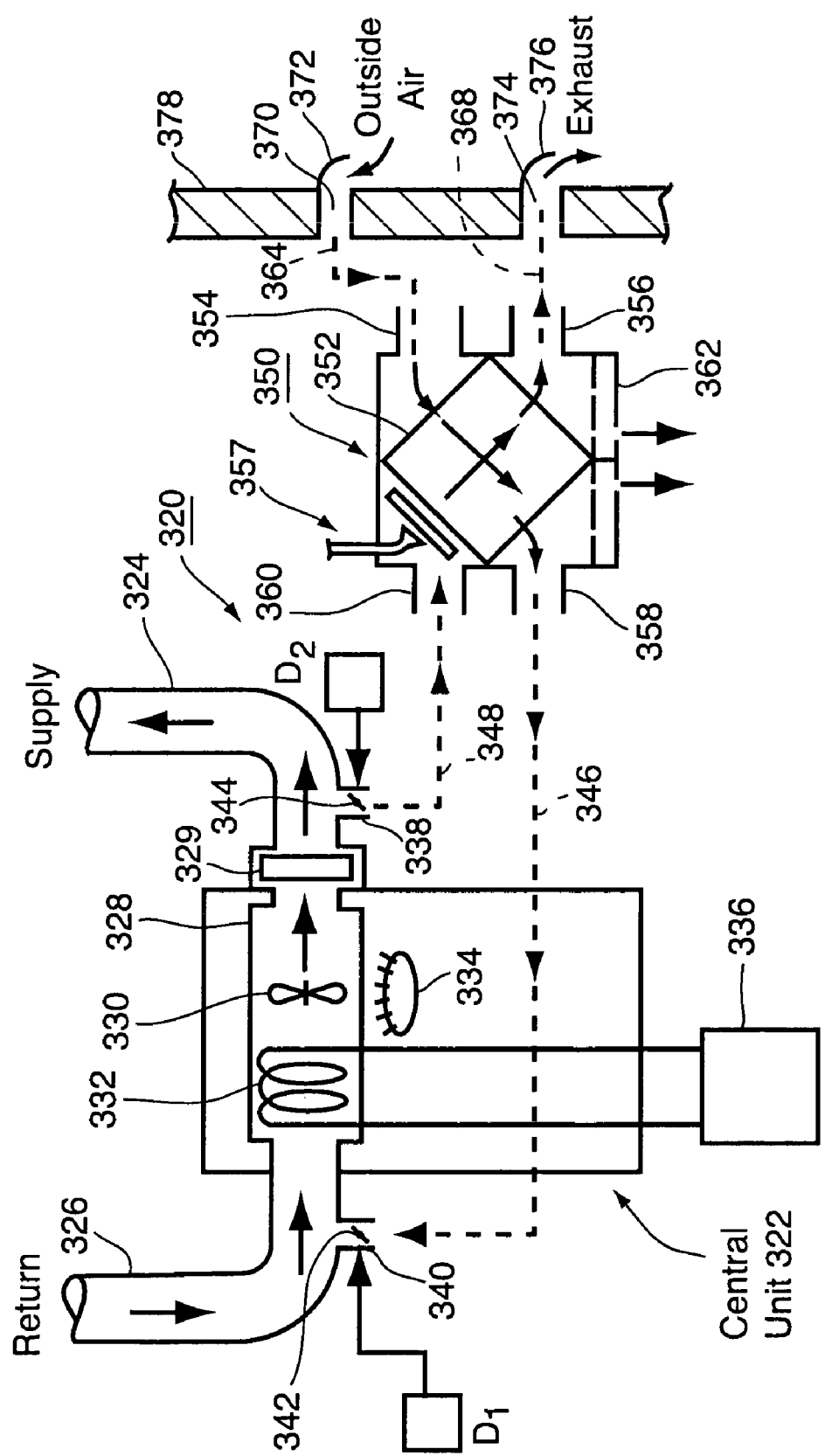

VENTILATOR SYSTEM AND METHOD

This is a continuation-in-part of U.S. patent application Ser. No. 09/579,739, filed May 26, 2000 now abandoned, which is a division of U.S. patent application Ser. No. 09/188,729, filed Nov. 9, 1998, now U.S. Pat. No. 6,176,305, and also is a continuation-in-part of U.S. patent application Ser. No. 09/829,772, filed Apr. 10, 2001 now U.S. Pat. No. 6,983,788, the disclosure of which hereby is incorporated herein by reference.

This invention relates to ventilator systems and methods, and particularly to ventilator systems and methods using heat exchangers to exchange heat between exhaust air leaving an enclosed space, and outside air entering the space.

It is increasingly common to make modern homes and commercial buildings very air-tight in order to reduce heating and cooling costs. As a result, it has become increasingly necessary to bring fresh air into the building in order to avoid an extreme reduction of oxygen in the building, which can cause the illness or even death of the occupants.

In order to protect the health of the occupants, it is very desirable to prevent the air being exhausted from the enclosed space from mingling with the incoming outside air. Thus, often the heat exchangers which are used are those in which the flow of exhaust air is isolated from the flow of outside air through the heat exchanger. These are sometimes called "isolating" heat exchangers.

Some isolating heat exchangers are of the plate type, and others are of the rotary heat-wheel type. Although the isolation provided by the plate type heat exchangers usually is more complete than for the rotary heat exchangers, the rotary heat exchangers can be more compact and can provide other advantages under certain circumstances.

Prior ventilator systems have been designed to use heat exchangers to transfer heat from the exhaust air, in cold weather, to the outside air to pre-heat the outside air before it enters the building, and to transfer heat from the outside air to the cooler exhaust air in hot weather, thus saving energy and reducing the cost of cooling and heating.

It also has been proposed to further foster economy by the method of by-passing the exhaust air around the heat exchanger during times when a comparison of outdoor and indoor air temperatures indicates that there could be an advantage in so doing.

Applicant has recognized that such prior systems have various shortcomings that make them relatively complex and difficult to control, relatively complex and bulky in structure, and expensive to build and maintain in good operating condition.

Accordingly, it is an object of the present invention to provide a ventilating system and method in which the foregoing problems are eliminated or alleviated.

More particularly, it is an object of the invention to provide a ventilator system and method which has a plurality of operating modes and a controller and method of control which are relatively simple and reliable in operation, while being efficient and relatively simple and inexpensive to build and maintain.

In particular, it is an object of the invention to provide a ventilating system which is relatively compact, with a relatively small number of moving parts and sensors; a system which does not change its mode of operation with excessive frequency and resultant wear.

A particular problem addressed by the invention is that relying solely on inside air temperatures or comparisons between inside and outside air temperatures in changing heat exchange modes often does not produce a satisfactory result.

A problem often is created by the location of an indoor air temperature sensor. If it is located at or in the ventilator, there is no assurance that it will correctly indicate the need for heating or cooling at a remote location in the enclosed space. Although this is true for small spaces, it is especially true for large spaces such as those in commercial office buildings, computer centers, manufacturing facilities, hospitals, auditoriums, arenas, etc.

In commercial buildings the space to be conditioned often is divided into different zones, each with one or a plurality of conditioning units such as refrigeration units, furnaces, etc. Often it is most practical to use one ventilator to supply fresh air to a single zone encompassing a relatively large volume and serviced by plural conditioning units. In such spaces, the inventor has realized, the measurement of a meaningful indoor temperature is difficult, and such a measurement often is not a reliable indicator of the heating and/or cooling needs of the enclosed space.

Therefore, it is an object of the invention to provide a ventilator control system and method in which the ventilator is operated reliably to work in harmony with the heating and cooling system for an enclosed space to reduce or minimize the energy requirements for heating, cooling and ventilating the space.

In accordance with one embodiment of the present invention, an energy recovery ventilating system and method are provided in which the operation of the ventilator is controlled according to a profile, stored in computer memory, for a particular enclosed space, such as an entire building or a part of a building, which is a function of the time-varying needs of the space for heating and cooling. In particular, the expected occupancy and the outdoor temperatures are used to develop the profiles stored in computer memory.

In one embodiment of the invention, the operation of the ventilator is controlled by the building management system ("BMS") computer used to control the heating and cooling of the enclosed space. The BMS computer is specially programmed to provide the desired set-points for the ventilator system, in addition to its normal operation. The BMS computer can be used to provide the necessary control for each of several different ventilators for different building zones.

In another embodiment of the invention, the building profile(s) are stored in a stand-alone controller which uses the profiles to control a ventilator or a plurality of ventilators.

The control system and method of the invention are relatively simple to implement, reliable in assisting in the heating and cooling and other treatment (e.g., dehumidification and humidification) of the air in the enclosed space, and do not create excessive wear on the ventilator components.

Although a variety of structures and methods can be used, a preferred method of reducing or eliminating heat transfer between the exhaust air and the fresh air is to simply reduce the speed of or stop the exhaust air handler while running the fresh (outside) air handler. This saves the relatively high cost of dampers, damper motors and the ductwork required by the use of a by-pass duct for the same purpose.

In accordance with one embodiment of the invention, the defrost mode of operation also is controlled in software by simply turning off the fresh air handler periodically while the exhaust air handler runs. For example, the outside air handler is shut off for one minute out of every twenty minutes of operation.

The defrost operation also can be accomplished by any one or more of the methods of reducing outside air flow; by-passing outside air flow around the heat exchanger; and heating the outside air before it reaches the heat exchanger.

A further feature of the invention is the use of an all-plastic heat exchanger, especially in combination with an evaporative cooling device. The fact that the plastic has a conductivity to heat that is well below that of metal is more than compensated for by the lower cost and greater resistance to corrosion to the water flow encountered due to condensation and evaporative cooling of the plastic heat exchanger.

Several different types of heat exchangers are usable in the invention; an all-plastic plate-type heat exchanger; a rotary heat exchanger; a desiccant wheel; a combination of desiccant wheel and plate type or multiple plate-type heat exchangers also can be used. Although plastic is preferred as a material for the heat exchanger, for the reasons given above, metal also can be used where its properties are needed and the extra cost is justified.

When evaporative cooling is used, the efficiency of the cooling process can be improved by heating the feed water used in the process by placing a heat exchanger in the path of the incoming heated outside air, and running the feed water through the heat exchanger.

It is preferred that the exhaust air handler be a suction blower located at the downstream side of the heat exchanger when evaporative cooling is used, thus increasing the air pressure drop and, hence, the effectiveness of the evaporative cooling process.

The use of a desiccant wheel or a recirculated desiccant liquid spray to dry the incoming outside air further aids the refrigeration system used for cooling the enclosed space by reducing the amount of moisture the refrigeration system must remove in order to produce a desired comfort level in the space.

A particularly simple, compact and inexpensive integrated ventilator is provided which needs no air movers of its own. Heated or cooled positive-pressure air is extracted from the supply duct of a central heating/cooling unit with a fan for circulating heated or cooled air through ducts to an enclosed space. A minor proportion of the output air is delivered to the exhaust inlet of a heat exchanger.

Similarly, a minor proportion of the return air to the heating/cooling unit is supplied from the fresh air outlet of the heat exchanger.

The cold or hot air extracted from the central unit either cools and dehumidifies outside air or heats the outside air, thus greatly assisting the central unit in conditioning the enclosed space.

The ventilator is relatively compact and inexpensive, and provides highly effective latent heat transfer due to relatively large temperature differences which often exist between the outside air and exhaust air flowing through the heat exchanger.

Using greater temperature differentials in this manner increases the ratio of latent cooling to sensible cooling in the heat exchanger to more completely condition relatively humid outside air.

The foregoing and other objects and advantages of the invention will be set forth in or apparent from the following description and drawings.

IN THE DRAWINGS

Figure 16:
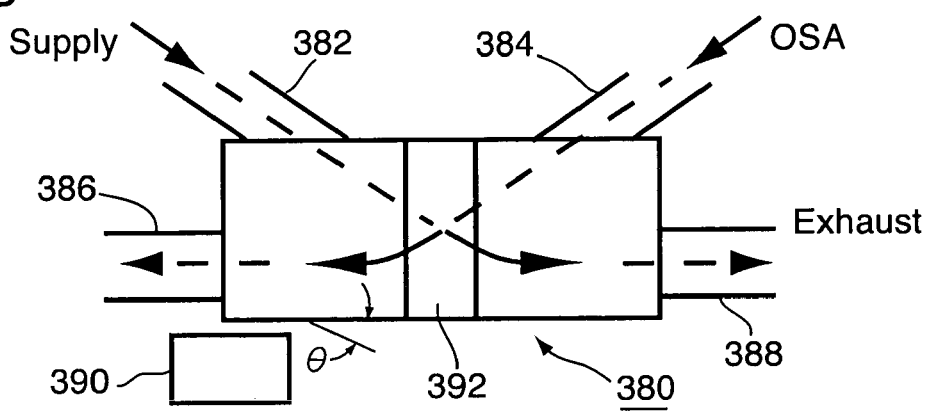
Figure 17:
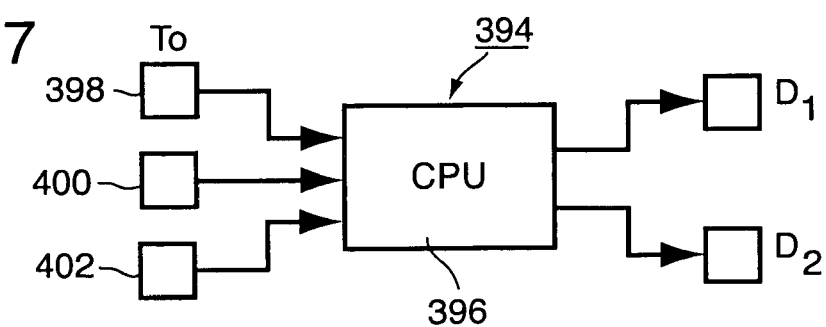

Each of FIGS. 11–15 is a schematic view of another embodiment of the invention;

FIG. 16 is a schematic view of an alternative plate type heat exchanger for use in the FIG. 15 and other embodiments of the invention which use a plate-type heat exchanger; and FIG. 17 is a schematic block diagram of a controller for the FIG. 15 embodiment.

GENERAL DESCRIPTION

Figure 1:
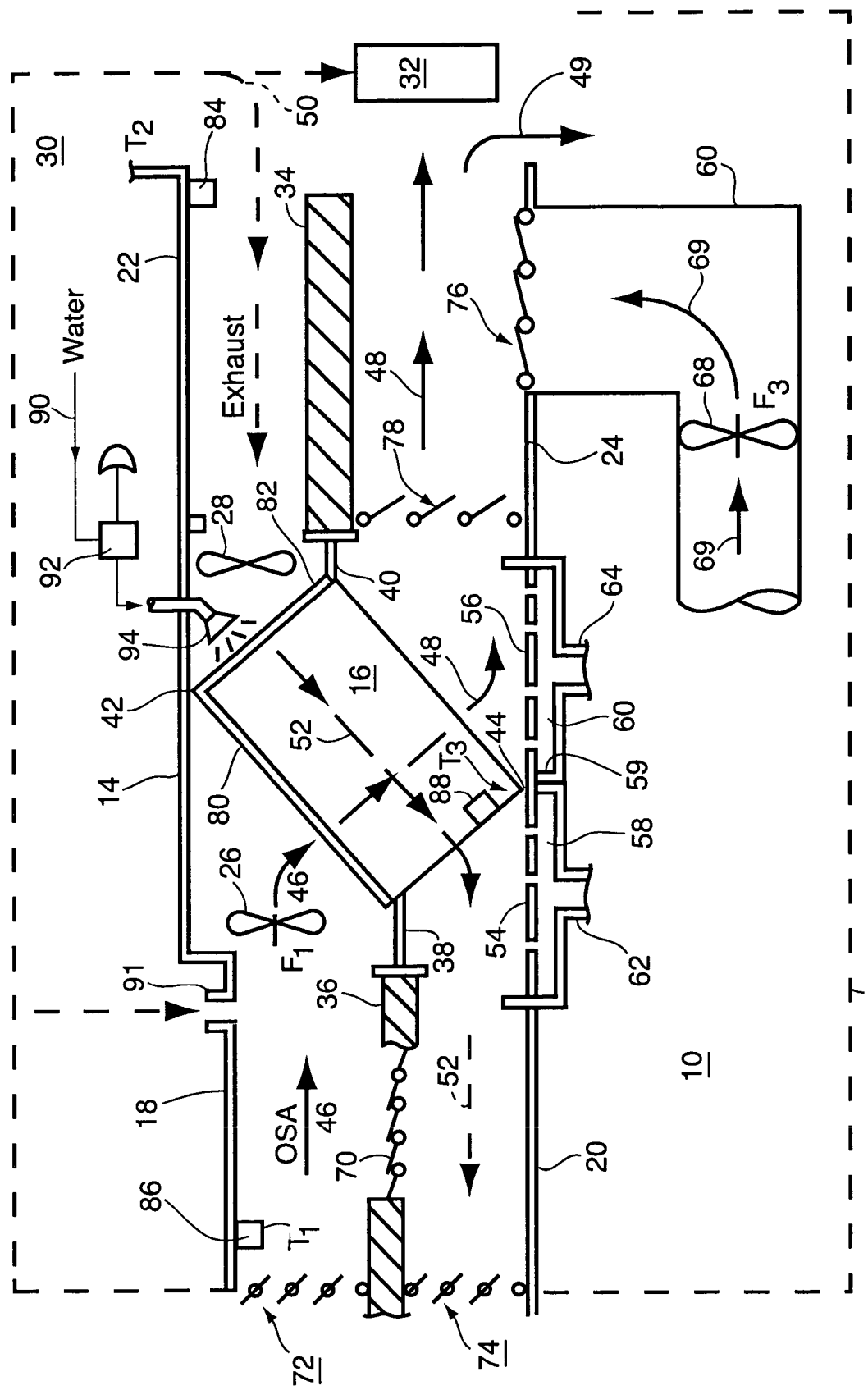
FIG. 1 is a schematic side-elevation and cross-sectional view of a ventilating system constructed accordance with the present invention.

FIG. 1 shows a ventilating system 10 of the present invention in schematic form.

The ventilating system 10 is in use to provide ventilation to an enclosed space indicated schematically by the dashed line 12. This enclosed space can be a residence, a business office, a skyscraper or other type of enclosed space.

The ventilating system 10 includes a housing 14 in which is mounted a heat exchanger 16, an exhaust air fan 28, and an outside air fan 26.

The heat exchanger 16 is mounted in the housing 14, tilted as shown in FIG. 1, with its upper and lower edges 42 and 44 sealed to the top and bottom walls of the housing, respectively, and with the other corners of the heat exchanger attached with sealing members 38 and 40 to the side walls of the housing, also so as to provide an air seal between adjacent sides of the heat exchanger.

The unit described so far is supplied as a free-standing module. Attached to it, as in a typical installation, is an outside air inlet duct 18 and an exhaust air outlet duct 20. Both of the ducts 18 and 20 communicate with the ambient air outside of the enclosed space 12.

Attached at the other end of the housing 14 are an exhaust inlet duct 22 and an outside air outlet duct 24. The mounting of the heat exchanger 16 in the housing, with the seals at its four corners, provides two isolated air flow paths through the heat exchanger.

One path is shown by arrows 46 and 48 extending from the outside air inlet duct 18 downwardly and to the right and out through the duct 24, in the direction shown by the solid arrows through the heat exchanger 16.

The other flow path is from the exhaust inlet duct 22 through the heat exchange 16 in the direction of the arrow 52 and out through the exhaust outlet duct 20, as shown by the dotted arrows passing through the heat exchanger in FIG. 1.

The flow paths taken by the outside air and the exhaust air through the heat exchanger 16 are isolated from one another so that the two air streams do not intermingle, thus helping to protect against contamination of the incoming outside air.

The outside air flow through the duct 24 flows through other ducts (not shown) and usually is delivered to one of three locations. Either it is mixed with return air entering the system 30 and delivered to a heating/refrigeration unit 32 to either heat or cool the air, or it is delivered directly into the enclosed space 12, as indicated by the arrow 49.

It should be understood that in ventilating some spaces, such as in hospitals and other critical environments, it is desired to use 100% outside air for heating or cooling in the enclosed space, thus maximizing the protection against air contamination. In such circumstances, the outside air is not mixed with the return air.

Temperature sensors are provided at 84 and 86, the inlet to the exhaust duct 22 and the inlet to the outside air duct 18, respectively, or at other suitable locations. The temperature sensor 84 senses the actual indoor temperature, and provides a corresponding electrical signal. Similarly, the temperature sensor 86 senses the outside air temperature and provides a corresponding signal.

These signals are delivered to the microprocessor-based controller shown in FIG. 4, which uses the temperature signals to control the operation and to selectively control the exchange of heat between the exhaust and outside air streams and other functions to be described below.

Figure 5:
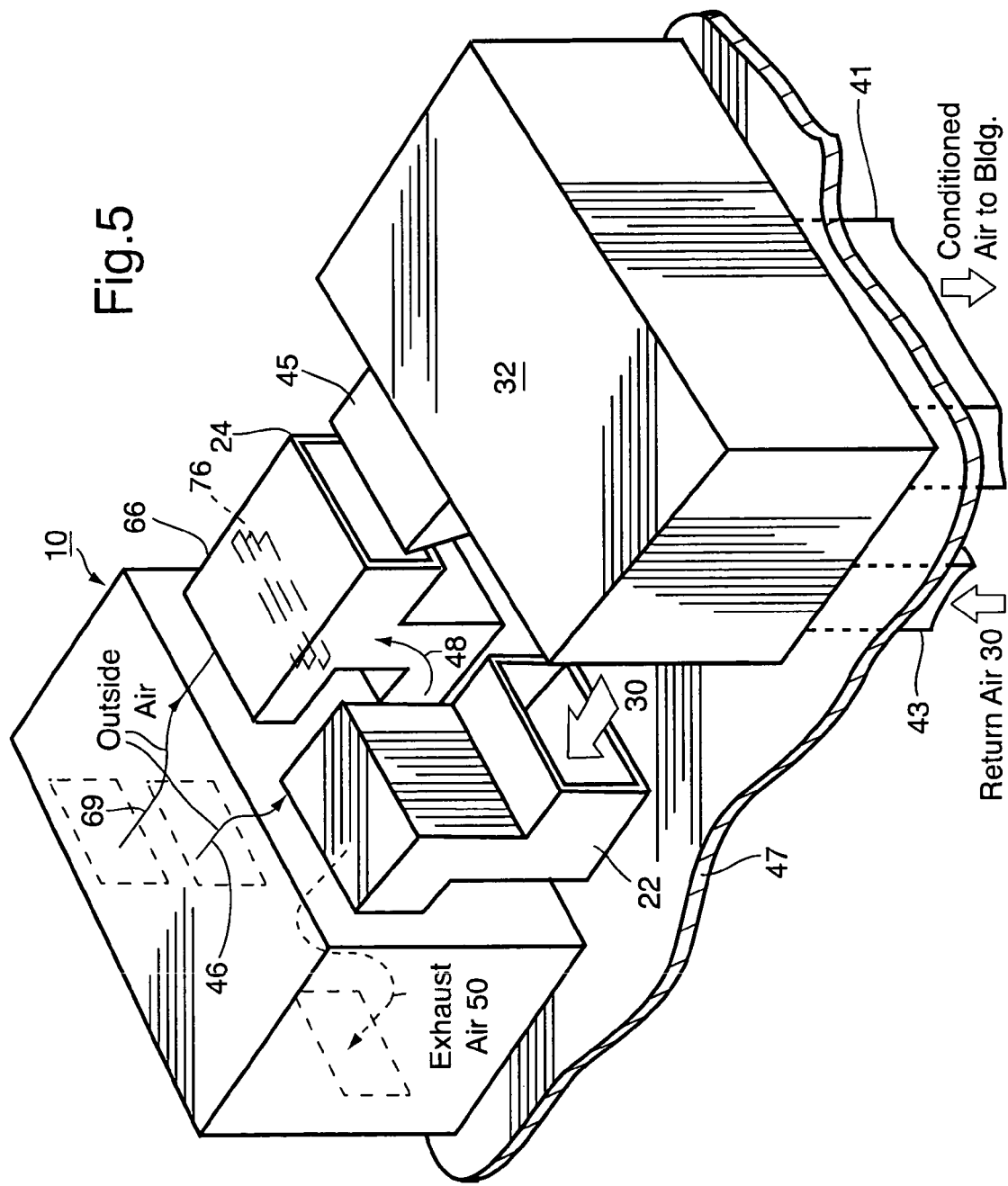
FIG. 5 is a perspective, partially exploded view of a roof-top installation of the ventilator of the present invention.

FIG. 5 is a perspective view of a typical installation of the ventilating system 10 and a heating/refrigeration unit 32 on the roof 47 of a building. The unit 10 is shown separated from the unit 32 for the sake of clarity in the drawings.

Return air from the building returns to the unit 32 through the duct 43 and part or all of it flows through the exhaust conduit 22, through the heat exchanger (not shown in FIG. 5) and out through the exhaust outlet.

Outside air enters the unit 10 and flows either through the heat exchanger along path 46, or through a by-pass 66 and gravity louvers 76 (to be described below) to the outside air duct 24, which is connected to the unit 32 through a fitting 45.

Heating Mode

The first mode of operation to be described is one in which heating of the enclosed space is provided by a furnace or other heating means. Usually, the outside air temperatures are below 50° F., for buildings with large heat sources, such as large banks of computers or intense lighting, or solar energy-absorbing surfaces, etc. Of course, this temperature also can be higher, where the internal heat generation is at a lower level.

In residential buildings, the outside air temperature at which heating is first required usually is considerably higher, say 60° F. or 65° F., because internal heat generation usually is lower than in most commercial buildings.

As it will be described below in connection with FIG. 4, the operation of the ventilating system is controlled by a programmed microprocessor 96. The heating mode is started when the outside air temperature reaches a pre-determined level which can be different for each building or space within a building. For this reason, the microprocessor is of the field-programmable variety so that the heating mode start point can be set independently for each building.

The fans 26 and 28 are variable-speed fans. During the heating mode of operation, preferably the fans 26 an 28 operate at a near maximum speed, thus providing pre-heating of the outside air entering the enclosed space so as to reduce the cost of heating the space.

Of course, the speeds of the fans 26 and 28 can be varied as desired to increase or decrease the corresponding air flows as required by the enclosed space.

Supplemental Cooling Mode

In accordance with the present invention, a supplemental cooling mode of operation of the ventilating system is provided in which outside air is taken in but heat transfer between the exhaust air and the outside air is reduced or eliminated so that the cool air will not be heated substantially by the exhaust air and will be supplied at or near the outside temperature for use in cooling the interior of the enclosed space.

Usually, this mode of operation occurs when the temperature in the enclosed space, as sensed by the temperature sensor 84, is above a desired level, e.g., 70° F., so that cooling is needed, while the outside air temperature is below the desired level. Typically, the supplemental cooing mode will most often be desired when the outside air temperature is in the 50° F. to 70° F. range.

By this means, the natural cooling potential of the outside air can be used to cool the enclosed space, either with or without the use of refrigeration or other cooling.

This mode of operation is particularly advantageous because many commercial buildings require cooling when outside temperatures are relatively low. For example, because of the use of substantial amounts of heat-generating computers or other office machines, indoor lighting, groups of people, solar heating through building windows, etc., many commercial buildings have a heat build-up which is not dissipated by only moderately cool outside temperatures, so that cooling is required.

During this mode of operation, heat exchange between the exhaust air and outside air is reduced or eliminated by one of several different methods. Only the simplest one will be described here. That is to simply slow or stop the exhaust fan 28 so that either less or no exhaust air will pass through the heat exchanger and heat the incoming outside air. Other methods will be described below.

Cooling Mode

This mode of operation is used when the outside air temperature is above that desired for the enclosed space. When the weather outside is hot, and the air exhausted from the enclosed space is cooler than that coming in from outside, the exhaust air cools the outside air in the heat exchanger 16 before it enters the enclosed space. If necessary, the outside air then can be sent to a refrigeration unit 32 to be cooled further. This can significantly reduce the load on the refrigeration unit and reduce the cost of hot weather air conditioning. Some de-humidification of the outside air also is accomplished.

As during the heating mode, preferably, both fans 26 and 28 are operated at maximum speed.

Outside Air By-Pass

In accordance with another aspect of the present invention, a by-pass conduit 66 is provided for introducing outside air into the enclosed space 12 under selected conditions. By-pass conduit 66 also has its own independently operable variable speed fan 68 for delivering outside air into the outside air duct 24.

One of the conditions in which the by-pass duct is useful is during the supplemental cooling mode of operation described above. During this mode, heat transfer between the exhaust air and the outside air can be prevented without stopping the exhaust fan 28 simply by slowing or stopping the fan 26 and running the fan 68. This allows warm interior air to be exhausted and cool outside air to be introduced, with less or no heating of the outside air.

Another advantage of the invention is that the by-pass can be used for two different functions; it can be used as a supplemental cooling mode by-pass, as described above, and in defrosting the heat exchanger.

Louver System

The optional louver system for use in conjunction with the by-pass, and also for other functions, now will be described.

A set of gravity-type louvers is provided at 76 at the exit of the by-pass 66 into the duct 24.

A set of motorized louvers 70 is provided in a septum or wall 36 separating the ducts 18 and 20.

Two other motorized louvers 72 and 74 are provided, respectively, at the entrances to the ducts 18 and 20.

Additional gravity-operated louvers 78 are provided at the outlet from the housing 14 into the duct 24.

Gravity operated louvers open in response to an air pressure differential in one direction, but close either under gravity or pressure in the opposite direction. In general, it is preferred to use gravity-type louvers instead of motor-driven louvers, wherever possible because they tend to operate smoothly over long periods of time without significant maintenance and also are less complicated and expensive. Gravity louvers work either in a vertical or horizontal orientation.

The operation of the louvers during various different phases of the operation of the system will be described below.

Defrost Mode

The exhaust air from the enclosed space during the cooling mode has a certain level of humidity, say, 55% or thereabouts. When the warm, humid air from the interior of the enclosed space passes through the cold heat exchanger, moisture condenses from the air and condensate and water runs downwardly out of the heat exchanger and through holes in perforated floor panels 54 and 56 of the housing 14 to drip pans 58 and 60 with drains 62 and 64 for removing the accumulated water. The drip pans are isolated from one another by a septum or wall 59 in order to preserve the isolation of the outside air path from the exhaust air path.

When the outside air temperature is very low, the water accumulating in the heat exchanger starts to freeze and clog up the passages in the heat exchanger. This reduces the heat exchange efficiency of the heat exchanger, increases the pressure drop across the heat exchanger, and can totally disable it. Therefore, means are provided for defrosting the heat exchanger when freezing conditions are detected.

Freezing conditions are detected preferably by means of a temperature sensor 88 mounted near the lower portion of the heat exchanger where ice tends to accumulate first. When the temperature sensed by the sensor 88 reaches freezing (32° F. approximately), the temperature sensor sends a signal to the control system which starts the defrost operation.

In its simplest form, the defrost operation comprises simply reducing the speed of the outside air fan 26 while leaving the speed of the exhaust fan 28 at its original maximum speed, thus reducing the cooling of the heat exchanger and allowing the warmth of the exhaust air to melt the ice in the heat exchanger and bring its temperature up to above the freezing level. When the temperature sensed by the sensor 88 rises to the desired level again, the speed of the fan 26 is restored to its previous level.

This operation is repeated as often as necessary to prevent icing of the heat exchanger.

The simple defrosting method described above is adequate in many circumstances. However, more heating of the heat exchanger may be required in order to defrost it. If so, the intake of outside air can be stopped completely for a time until the temperature of the heat exchanger rises.

In accordance with another aspect of the invention, if it is desired to maintain the flow of outside air into the enclosed space at a steady level, even during defrost, then the fan 68 in the by-pass duct 66 can be turned on to bring in outside air without passing it through the heat exchanger, to either supplement the air brought in by the slowed fan 26, or to replace it entirely.

It is possible that further heating of the heat exchanger beyond that provided by the means described so far would be necessary. In such cases, by closing the louvers 72 and 74 and opening the louvers 70, the exhaust air is recirculated back through the outside air flow passages and into the enclosed space, thus using the residual heat in the exhaust air for further heating and defrosting. Thus, exhaust air exiting the heat exchanger can pass upwardly from conduit 20 into conduit 18, through the outside air passages in the heat exchanger, and out through the duct 24 back into the enclosed space.

Even further heating of the heat exchanger can be provided by other means such as the introduction of steam into the inlet 91 in the duct 18 so as to preheat the outside air before it reaches the heat exchanger. Of course, this requires additional energy and should be restricted to uses in which it is considered most beneficial, such as in hospitals and other institutions. Other heat sources also can be used to supply the necessary supplemental heat.

When the by-pass fan 68 is operated, the air pressure it produces lifts the louvers 76 and allows air to pass into the duct 24. If there is no air flow created by the fan 26 through the louvers 78, the back pressure produced by the fan 68 closes the louvers so that outside air does not flow backwardly through the heat exchanger.

Means other than a temperature sensor can be used to detect freezing conditions. For example, air pressure sensors to detect the change in pressure caused by ice formation are known in the prior art and can be used, if desired.

Evaporative Cooling

During the cooling mode of operation, it is preferred to use a relatively low-cost method of further reducing the temperature of incoming outside air so as to decrease the cooling load on the refrigeration system. This is provided by an evaporative cooling system including a spray nozzle 94 (FIG. 1) and a solenoid-operated valve 92 selectively supplying pressurized water from the supply line 90 to the spray nozzle 94. The spray 94 sprays water into the exhaust air before it enters the heat exchanger 16.

Preferably, the water from the spray nozzle 94 is sprayed onto an air-permeable membrane 82 which covers the exhaust air entrance to the heat exchanger.

Figure 2:
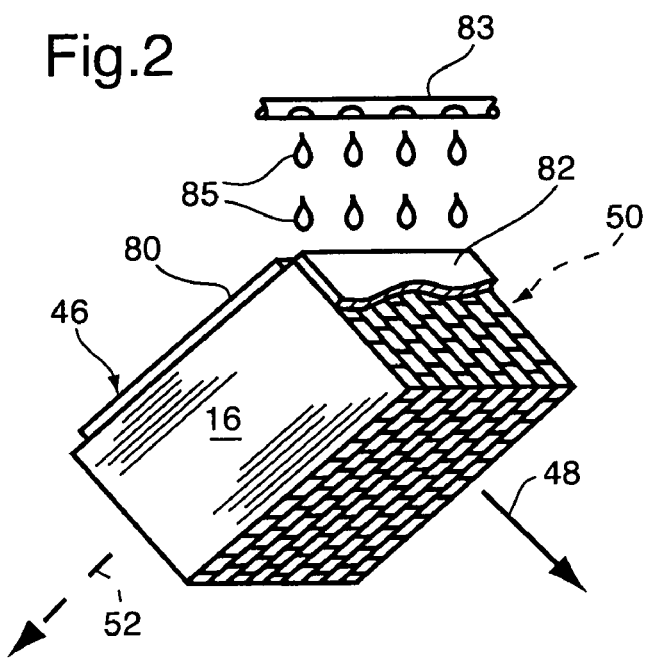
FIG. 2 is a perspective view of a heat exchanger used in the system shown in FIG. 1.

FIG. 2 is a perspective view of the heat exchanger 16 showing the membrane 82 (broken away). The membrane 82 preferably comprises a thin mat of synthetic fibers such as those used in ordinary air filters so as to enhance the evaporation of the weather in the exhaust air stream to give evaporative cooling of the exhaust air. Such a mat is made of fibers which do not deteriorate due to prolonged contact with water and the air which impinges on the membrane.

Alternatively, as shown in FIG. 2, water can be dripped from one or more pipes 83 with holes 85 in it to drip water onto the membrane. The water migrates downwardly through the membrane under the force of gravity.

Any water which accumulates in the heat exchanger due to the water spray will drain out through the bottom of the heat exchanger and into the drip pans 58 and 60, the same as condensate.

Evaporative cooling can reduce the temperature of the incoming air by a very significant amount, and is not very costly in terms of either materials or energy required. Therefore, it is a very cost-effective way of preconditioning the outside air to reduce the energy requirements of the refrigeration system. Again, as with other operations of the system, the evaporative cooling equipment preferably is turned on in response to the detection of an outside air temperature which is greater than the desired inside air temperature by a certain minimum amount.

For example, the minimum temperature difference in question might be 3° F. to 10° F. Thus, if the outside temperature were 72° F. and the desired space temperature is 70° F. and the minimum differential is 10°, the evaporative cooling system would not operate. When the outside air temperature reaches 80° F., the evaporative cooling system will turn on and operate continuously until the outside air temperature drops below the desired level.

Control System

Figure 4:
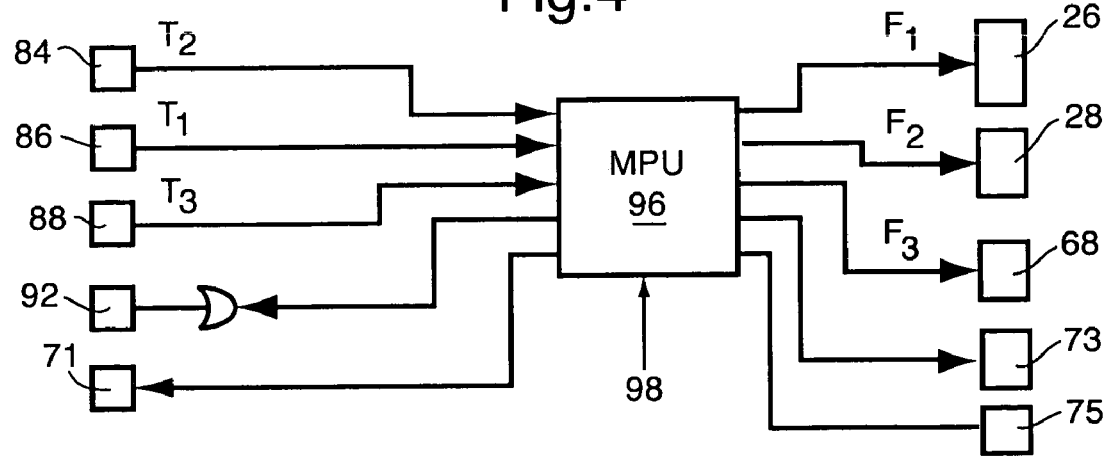
FIG. 4 is a schematic diagram of a control circuit for controlling the operation of the system shown in FIG. 1.

FIG. 4 shows schematically the control circuit of the ventilation system of the present invention. A microprocessor 96 is provided and programmed so as to control both the turning on and off and the speed of each of the fans 26, 28 and 68 in response to the signals sent to the microprocessor by the temperature sensors 84, 85 and 88. Operating signals are sent by the microprocessor also to the louver motors 71, 73 and 75 to operate the powered louvers and the solenoid valve 92 to start and stop the water spray for the evaporative cooling system described above.

As noted above, it is preferred that the microprocessor be field-programmable to allow the variation of set-points, etc., for each installation.

The microprocessor also is programmed to have certain "dead-bands" around the various control points to prevent excessive "hunting". Preferably, the dead-bands also are field-programmable in order to enable the customization of the system for a particular enclosed space.

For example, a dead-band of 3° F. to 5° F. or more around each set-point can be beneficial. Manual override also can be provided to enable adjustments for special circumstances. Automatic control of some set-points also can be provided. For example, the switch-over from supplemental cooling mode to heating mode can be delayed, even though a sudden cold-snap reduces the outside air temperature to below the heating mode set-point, if the inside air temperature is still high enough to require cooling.

Heat Exchanger

The heat exchanger 16 has a rectangular shape and preferably is made of plastic. It is preferred that the heat exchanger be of the type shown in U.S. Pat. No. 4,820,468 to M. J. Hartig, which is sold by the Hartig Company, Wilmington, Del.

Figure 3:
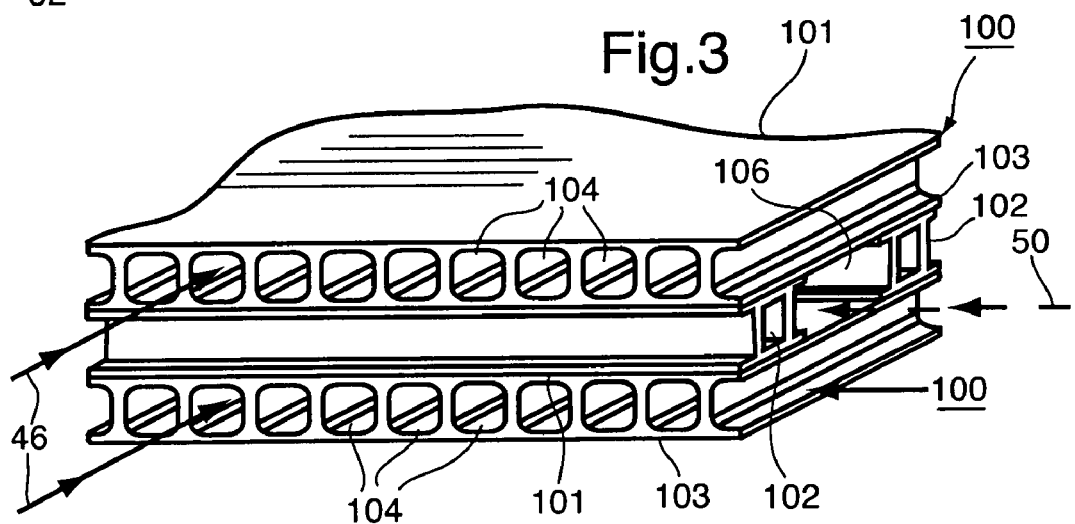
FIG. 3 is a perspective, broken away enlarged and partially schematic view of a portion of the heat exchanger shown in FIG. 2.

The structure of this heat exchanger is illustrated in FIGS. 2 and 3, and particularly in FIG. 3. The heat exchanger structure comprises a plurality of plastic extrusions 100 with closely spaced parallel passageways 104 separated by square extruded channel members 102 extending perpendicular to the direction of the passageways 104. Although only two of the extrusions 100 and a pair of channel members are shown in FIG. 3, for the sake of simplicity in the drawings, it should be understood that there are many extrusions and channel members in the typical heat-exchanger.

Each extrusion 100 comprises a solid top sheet 101 and a solid bottom sheet 103 with multiple vertical walls forming the passageways 104, on the one hand, and the spaces 106 between the channel members and the hollow interiors of the members 102. These crossed flow paths are isolated from one another by the solid sheets 101 and 103. The extrusions 100 and 102 are heat-welded together to form a strong, lightweight corrosion-resistant heat exchanger.

The exhaust air preferably flows through the larger passageways 106, as indicated by the arrow 50, and the outside air flows through the passageways 104. This arrangement is preferred because the exhaust air may have entrained water droplets and condensation and ice may form in the exhaust air passageways so that the larger passageways will remain operative for heat transfer over a wider range of operating circumstances than if the smaller passages were used. Although condensation also will occur when hot, humid outside air is cooled in the heat exchanger, it is believed that the larger passageways will better suit the conduct of exhaust air.

The material of which the heat exchanger 16 is made preferably is polyethylene or polypropylene, or other plastic materials which also are impervious to deterioration under prolonged contact with water and flowing air.

Equivalent heat exchangers also can be used in the practice of the invention. For example, isolating heat exchangers made of various metals can be used, as well as heat pipes whose ends are isolated from one another with one end in the outside air flow and the other in the exhaust air flow. Hydronic heat exchangers with liquid working fluids also can be used. Rotary heat exchangers and desiccant wheels can be used, as well as the improved all-plastic heat exchangers with integral housings shown in my copending patent application Ser. No. 09/829,772, filed Apr. 10, 2001.

The plastic heat exchanger described above is advantageous over the usual metal heat exchanger, even though the heat conductivity of the plastic is considerably lower than that of the metal. The plastic lasts a very long time without corroding and is considerably less expensive than metal. Also, the plastic heat exchanger is less expensive to manufacture than metal heat exchangers. The added volume required for the plastic heat exchanger to exchange the same amount of heat as a metal heat exchanger is more than offset by the foregoing advantages.

The plastic heat exchanger is believed to be particularly advantageous when used with evaporative cooling because any scale which forms from the water spray can be broken free relatively easily by flexing the heat exchanger.

Rotary Embodiments

Figure 6:
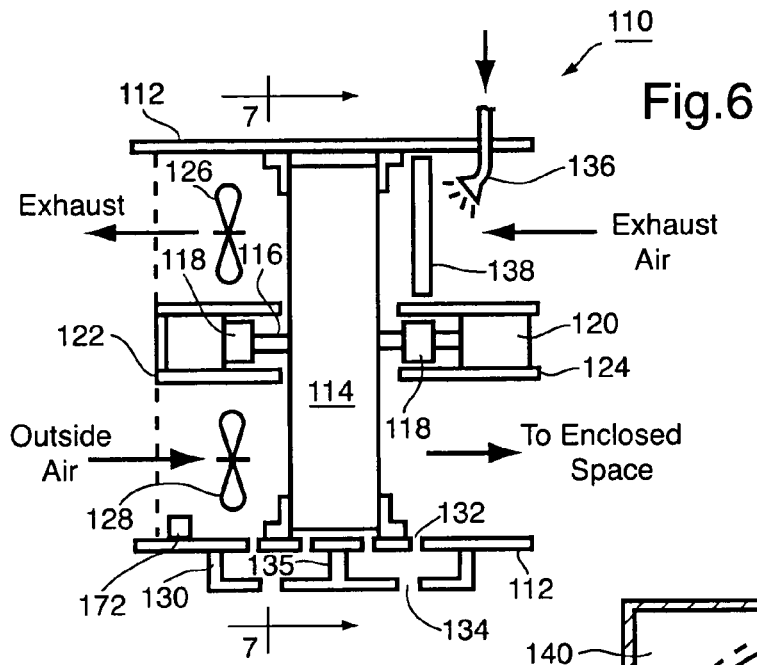
FIG. 6 is a side-elevation, partially cross-sectional and schematic view of another ventilator device of the invention.
Figure 7:
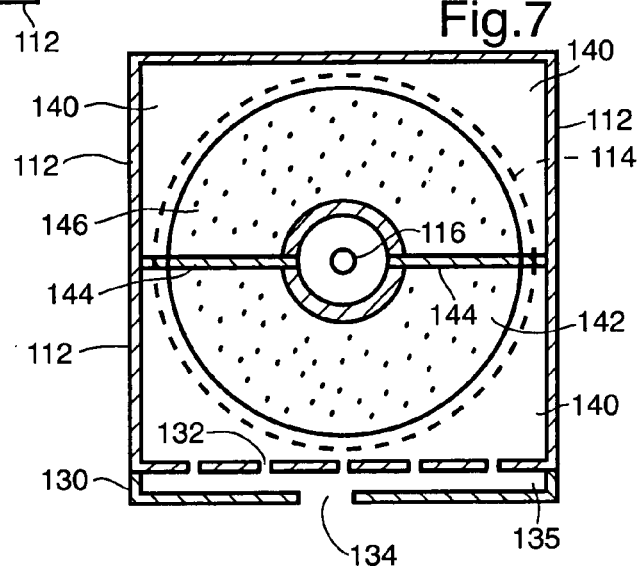
FIG. 7 is a cross-sectional view taken along line 7—7 of FIG. 6.
Figure 8:
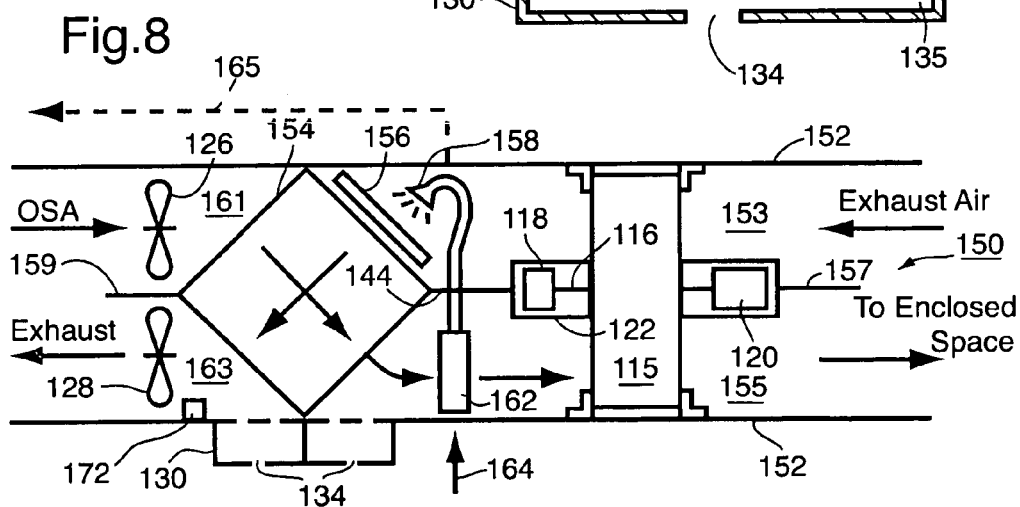
FIG. 8 is a schematic cross-sectional view of another embodiment of the invention.

FIGS. 6 through 8 show embodiments of the invention in which a rotary heat wheel or desiccant wheel is used advantageously for heat exchange and/or dehumidification of the incoming fresh air.

FIG. 6 is a partially cross-sectional and partially schematic view of a ventilator 110 using a rotary heat wheel 114 as a heat exchanger instead of the plate-type plastic heat exchanger described above.

The rotary heat exchanger 114 also sometimes is referred to as an "isolating" heat exchanger, although the isolation it provides is not a complete as with the plate-type heat exchanger described above. In addition, the rotary heat exchanger 114 often is more expensive than the plastic plate type heat exchanger described above. However, the heat exchanger usually is more compact and has other advantages which make it attractive, under certain circumstances, such as transferring moisture from one air column to another.

As it is well known, the heat wheel 114 typically is made of corrugated material packed into a circular metal frame. The materials of which it is made include corrugated metal, such as aluminum, corrugated plastic, or corrugated paper.

FIG. 7 is a cross-sectional view taken along lines 7—7 of FIG. 6 and illustrates schematically the many small axially-directed openings in the wheel formed by the corrugated materials.

The heat wheel 114 is rotatably mounted in a housing 112 on an axle 116 by way of bearings 118 in support structures 122 and 124. A motor 120 is driveably coupled to the shaft 116 to rotate the wheel continuously, usually at a relatively slow speed, e.g., less than 10 RPM.

As it is well known, the wheel typically is divided up into different sectors with drying air flowing through one sector and air to be heated in the other sector.

As it is well known, the wheel typically is divided up into different sectors with drying air flowing through one sector and air to be heated in the other sector.

As it is shown in FIG. 7, the wheel is divided into halves 142 and 146 separated by a horizontal wall 144 attached to the cylindrical center supports 122 and 124 and equipped with seals (not shown) which effectively separate the upper and lower halves of the wheel from one another.

An exhaust fan or blower 126 pulls exhaust air through the upper half 146 of the heat wheel, and a separate fresh air fan 128 pushes outside air through the lower half 142 of the heat wheel 114.

When the temperature of the exhaust air is higher than that of the outside air, heat is transferred from the exhaust air to the outside air. Moisture also is transferred from the exhaust air to the drier outside air.

When the temperature of the outside air is higher than that of the exhaust air, then heat and moisture are transferred from the outside air to the exhaust air by way of the heat wheel 114.

It should be understood that seals to prevent unwanted air leakage are provided as needed at the junctions between the heat wheel and the structures 122, 124, 144, and at the periphery of the heat wheel.

Optionally, a water spray nozzle 136 and a mat 138, such as those described above, are used to provide evaporative cooling of the exhaust air during warmer or hot weather. A drain structure 130 with a septum 135 and outlets 134 similar to the drain structure shown in FIG. 1 is provided to drain away condensate and excess water spray from the evaporative cooling equipment. Preferably, the water is recovered and reused.

FIG. 8 is a cross-sectional schematic view of another ventilator 150 of the invention using a plate-type plastic heat exchanger 154 of the type described above and in connection with FIGS. 1–5 (or the one shown in FIG. 16) in combination with a desiccant wheel 115 which is structurally similar to the heat wheel 114 except that its corrugations are coated with a hydroscopic material such as a silica gel which absorbs moisture from the air passing through it. As it is well known, when the wheel rotates to a position where heated and/or drier air flows through the wheel, the moisture is removed so that the desiccant material is "regenerated" and ready to dehumidify air passing through it in the dehumidification section of the wheel.

As shown in FIG. 8, the outside air passes through the lower portion of the desiccant wheel 115, and the exhaust air passes through the upper portion of the desiccant wheel.

The desiccant wheel 115 and the heat exchanger 154 are mounted in a housing 152 which has a horizontal wall 157 which divides the housing into an outlet conduit 155 and an inlet conduit 153. Similarly, a horizontal wall 159 separates the housing to the left of the heat exchanger 154 into an inlet conduit 161 for outside air and an outlet conduit 163 for exhaust air. Air seals (not shown) are used wherever needed.

Optionally, an evaporative cooling arrangement consisting of a spray nozzle 158 and a mat 156 are provided to cool the outside air flowing through the heat exchanger during warmer or hot weather.

In accordance with another advantageous feature of the invention, a heat exchanger such as a radiator 162 is positioned in the flow path of outside air when it exits the heat exchanger 154 and before it enters the lower half of the desiccant wheel 115. This is used to heat water flowing through the pipe 164 to the spray nozzle 158. Since such water often is relatively cold (e.g. around 55° F.), by heating it with outside air, the effectiveness and efficiency of the evaporative cooling process is improved, while simultaneously further cooling the incoming outside air to further cool or reduce the cooling load in the enclosed space.

It should be understood that the radiator 162 also can be used with each of the other embodiments of the invention using evaporative cooling.

The result of the combination shown in FIG. 8 is that the outside air is substantially cooled and dried to condition the air entering the enclosed space and make it substantially more comfortable, while reducing or eliminating the need for refrigeration equipment to cool and dehumidify the incoming fresh air. In cold weather, where the exhaust air has more moisture in it than the outside air, the desiccant wheel humidifies the incoming outside air.

The drive and mounting systems for the desiccant wheel 115 are essentially the same as those for the heat wheel 114.

If it is desired to operate the heat exchanger in the "free cooling" mode, a by-pass structure should be used for the exhaust air, in order to ensure proper operation of the desiccant wheel.

It should be understood that other known types of desiccant air treatment can be used to reduce the humidity of the incoming outside air. For example, as it is described below and shown in FIGS. 12 and 14, instead of the desiccant wheel, a liquid desiccant such as lithium bromide can be sprayed into the air and recovered, regenerated and recirculated. It is believed that this is an alternative most suitable for industrial applications, such as in breweries, factories, etc.

It also should be understood that the heat wheel 114 or desiccant wheel 115 can be used together with a "air curtain", which is a known device for purging the wheel and minimizing the transfer of potential contaminants from the exhaust air to the incoming air.

Control System

Figure 9:
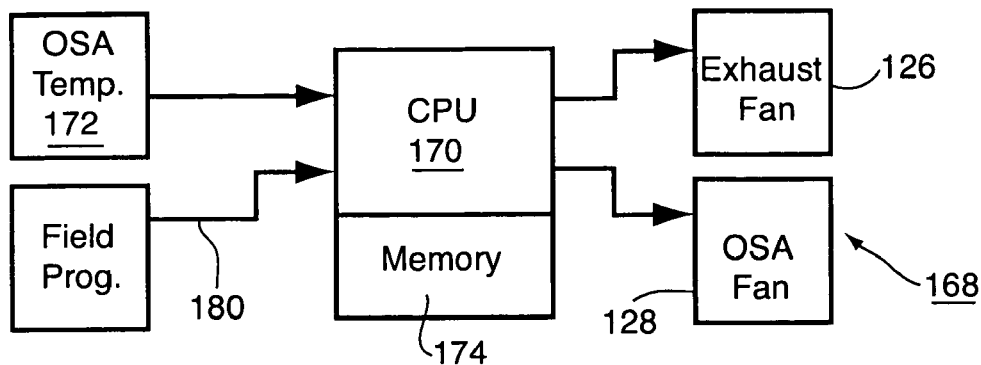
FIGS. 9 and 10 are schematic block diagrams of further embodiments of the control system of the invention.
Figure 10:
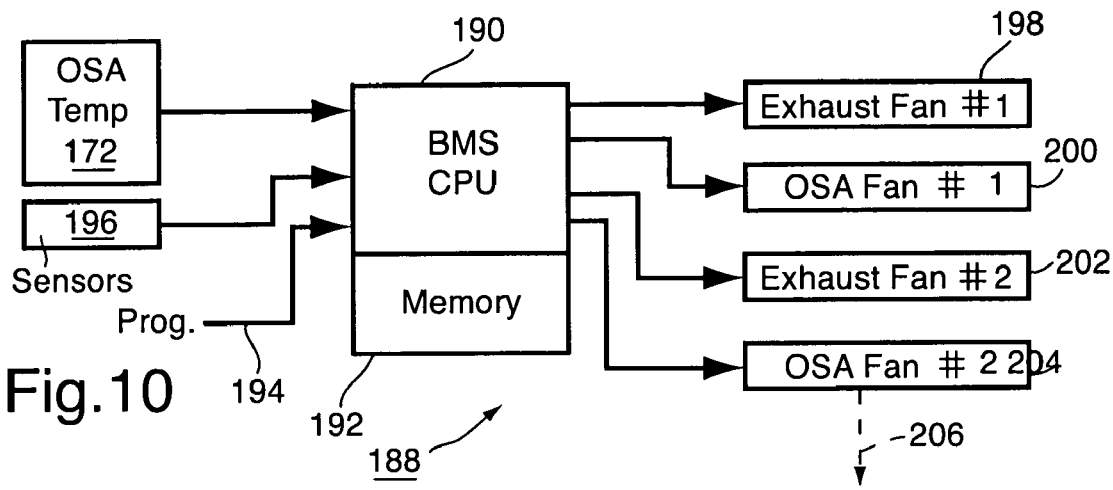

The preferred electronic control system for the invention is shown in FIGS. 9 and 10.

FIG. 9 shows a stand-alone control system 168, one of which is used in connection with each separate ventilator unit, and FIG. 10 shows a control system 188 in which the Building Management System ("BMS") computer is used to control one or a plurality of different ventilators used in connection with separate enclosed spaces, usually within a relatively large building. Preferably, the BMS computer is a computer system which often is used to control the heating, ventilating and air conditioning of many larger buildings.

The controller 168 preferably consists of a programmed microprocessor 170 with semiconductor and/or disc file and/or other suitable memory 174.

The programmed microprocessor controls the operation of the exhaust fan 126 and the outside air fan 128. Each of the fans preferably is a four-speed fan, and both the speed and the stopping and starting of each fan is controlled by the controller 168.

In contrast with the embodiment of the invention shown in FIG. 4, the only direct temperature measurement used as an input for the operation of the controller is the outside air temperature, which is measured by a sensor 172 (see FIGS. 6 and 8), or the sensor 86 shown in FIG. 1.

Otherwise, the operation of the ventilator is controlled by one or more profiles which are developed for each enclosed space, stored in memory and used to direct the operation of the ventilator in order to maximize the effectiveness and efficiency of use of the ventilator system in conjunction with the heating, ventilating and air conditioning system of the enclosed space in which the ventilator is used.

Each profile is a function of the time-varying heating and cooling needs of the enclosed space. Each profile is stored in computer memory 174 and preferably is retrieved at a time determined by an internal clock and calendar which also are stored in memory. The clock gives a continuous output which indicates the time of day, and the calendar gives the date and the week or month or other subdivision of a calendar year.

The profile for a particular enclosed space to be ventilated is developed by calculation and/or experience with the building over a period of time to determine the times and conditions when the mode of operation or speeds of fans, etc., are changed to maximize effectiveness of the system.

Basically, the approach taken in doing this is to compare the internal and external heating loads on the building, or an enclosed space within the building, with the external heating and cooling loads for the same space.

Factors considered in determining the internal heating and cooling loads include the following:
Number of people in the space;
Office equipment in use in the space;
Manufacturing equipment in use in the space;
Lighting in use;
Ventilation requirements;
Whether the space is occupied or unoccupied at a particular time, such as nights, weekends and holidays as compared with ordinary work days;
Seasonal changes of use;
Domestic hot water heating;
Cooking;
Exercise typically engaged in by occupants;
Heating and cooling equipment characteristics;
Fan motor heat;
Pump heat;
Possible equipment in-fighting, such as dual constant air system, heating and cooling at the same time, or reheat for an air conditioning system used for dehumidification, and incidental electric resistive heat for comfort during air conditioning;
Miscellaneous heating and cooling loads in the building.

The foregoing are compared with the following external heating and cooling loads on the enclosed space such as:
Solar heat;
Weather;
Seasonal changes;
Wind;
Time of day;
Orientation of the building to the sun;
Location of the building;
Windows and skylights in the walls enclosing the space;
Envelope construction;
"R" factor of walls;
Frequency of opening doors and other building openings;
Exterior geometry of the building;
Miscellaneous heating and cooling loads on the outside of the building.

When the internal heat loads are greater than the external cooling loads, the building is in a cooling mode; that is, it needs cooling. However, when the internal heat loads are less than the external cooling loads, the building is in a heating mode; that is, it needs heating. The changeover point between these two modes is one of the "set points" for the controller.

One way in which the cooling or heating mode is determined for a given space having plural heating or cooling sources is to take a weighted average of the state of those sources. For example, if a space is cooled by one 20 ton and five 10 ton refrigeration units, when the total number of tons of cooling in operation is greater than 35 (one half of the total tonnage), the space is in a cooling mode.

After initially determining the set points for a particular space, any of them can be changed in the field. For this purpose, the controller is made to be field-programmable, as it is indicated by the line 180 in FIG. 9.

In the simplest form, the profile can simply be a specific outdoor temperature measurement at which it is determined the changeover from heating to cooling will be required for the particular enclosed space. Then, whenever the outdoor temperature measurement is reached, the ventilator switches from one mode to the other. This can be programmed to occur at all times, or at specific times of year or times of day.

In another mode of operation, different profiles are stored for different periods of time, as it will be explained in greater detail below, and these profiles will be used to cause the changeover at the appropriate times.

More sophisticated profiles can be provided in accordance with the present invention. The heating and cooling needs of enclosed spaces in larger buildings depend upon such factors as the occupancy of the space—that is, the number of people occupying the space—the time of day, the operation of computers and/or other equipment, sunshine, internal lighting, etc., as noted above. Separate profiles can be stored for each of a variety of such different conditions, and selected for use based on a time-of-day clock and/or calendar stored in memory.

Following are some typical examples of profiles which can be used:

EXAMPLE #1

Profile:

Switch from heat-exchange ventilation mode to non-heat-exchanging or "free cooling" mode when the outside air temperature rises to 50° to 52° F. Outside air fan runs at full speed, exhaust fan is stopped during the free cooling mode.

Switch into defrost mode when the outside air temperature drops to 22°–24° F. Exhaust fan runs at full speed, outside air fan stops for one minute out of every twenty minutes.

Switch into heat-exchange ventilation mode from free cooling mode when the outside air temperature climbs to 65°–70° F. Both fans run full speed. Turn on evaporative cooling.

Use foregoing instructions during weekdays, 6 AM to 6 PM. During Saturdays and Sundays, reduce fan speeds to half speed. From 6 PM to 6 AM every day, and on holidays, turn ventilator off.

EXAMPLE #2

Profile:

Same as Example #1 except:

Reduce ventilator fan speeds to one half during 6 PM to 6 AM each day instead of stopping fans.

Reduce fan speed to 25% of full speed Saturday and Sunday.

Turn ventilator off on holidays.

Schedule ventilators to run at full speed 6 PM to 12 AM on specific days when nighttime meetings of numerous people will be held in the enclosed space.

EXAMPLE #3

Profile:

Same as Example #2 except:

Switch from free cooling to heat-exchange ventilation when BMS computer determines occurrence of heat balance.

The profiles can be changed at any time by re-programming the controller 168.

As it can be seen from the foregoing, one of the more significant factors used in the profiles is the expected occupancy of the space at specific times. The outdoor air temperature also is a significant factor. Indoor air temperature preferably is not used as a factor, in this embodiment, because it is difficult to accurately assess the heating/cooling needs of an entire space, especially in larger spaces, by measuring a temperature at a single location in that space. It is believed that this can cause inaccurate and inefficient operation of the ventilator at times, excessive mode changing, and added installation expense, if indoor temperatures are sensed at locations remote from the ventilator device.

Although relating the operation of the ventilator to inside temperatures may work well for relatively small spaces or spaces in which relatively uniform temperatures prevail, for commercial and other spaces, the use of pre-determined profiles is preferred.

FIG. 10 illustrates the integration of the control of the ventilator or ventilators for a building with the Building Management System 188. The system includes a CPU 190 with computer memory 192 and a line 194 indicating the programmable nature of the computer system.

Fans 198 and 200 are shown for a first ventilator, and other fans 200 and 204 are shown for a second ventilator. Other ventilators can be controlled by the same computer system, as is indicated by the dashed arrow 206.

Outside air temperature sensor 172 and other sensors 196 normally used with Building Management Systems controllers are shown.

In the system 188, the profiles for the individual ventilators are stored in memory 192 and are used to instruct the operation of each of the ventilators in the building. Otherwise, the system 188 shown in FIG. 10 operates in substantially the same manner as that shown in FIG. 9.

Multiple Heat-Exchanger Ventilators

Figure 11:
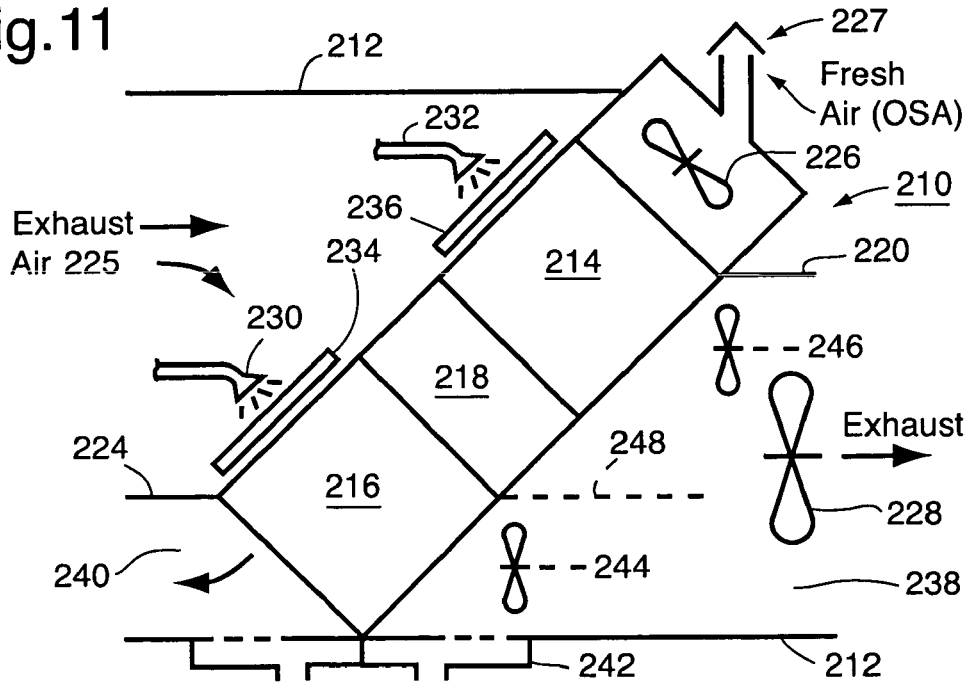

FIG. 11 is a schematic diagram of a ventilator 210 using two heat exchangers 214 and 216 interconnected by a plenum 218 to conduct fresh outside air through the two heat exchangers in series, while conducting exhaust air from an inlet 225 to the crossed heat exchange passages in the heat exchangers in parallel.

A single fresh air fan 226 draws fresh air into the ventilator through a vertical, covered inlet structure 227, forces the fresh air through the heat exchangers and out at 240 towards the enclosed space to be ventilated. The ventilator has an external housing 212 and internal walls 224 and 220 helping to define the exhaust air inlet 225, the fresh air outlet 240, and a exhaust outlet 238. A condensate and excess evaporative cooling water drain 242 also is provided. The inlet structure 227 is elevated and separated from the exhaust outlet 238 so as to minimize the chances of re-introducing exhaust air into the conditioned space.

In one embodiment, a single exhaust air mover or fan 228 is provided. In another embodiment, an additional internal wall 248, shown in dashed lines, is provided and two separate exhaust fans 246 and 244 are provided for the two heat exchangers 214 and 216, respectively.

Optionally, separate evaporative cooling devices are provided at the exhaust air inlet for each of the heat exchangers 214 and 216. The evaporative cooling device for the heat exchanger 214 includes a water spray nozzle 232 and a mat 236. The evaporative cooling device for the heat exchanger 216 includes a water spray nozzle 230 and a mat 234.

By means of the structure shown in FIG. 11, the incoming outside air is cooled in two separate heat exchangers to a substantially lower temperature than can be achieved in a single heat exchanger, yet using a single source of exhaust air from the enclosed space. Substantial dehumidification of outside air is provided.

By use of the separate evaporative cooling devices, the amount of cooling is correspondingly increased.

By means of the structure shown in FIG. 11, sufficient cooling sometimes provided so that either lesson or no refrigeration is needed to keep the enclosed space comfortable.

Liquid Desiccant Ventilators

Figure 12:
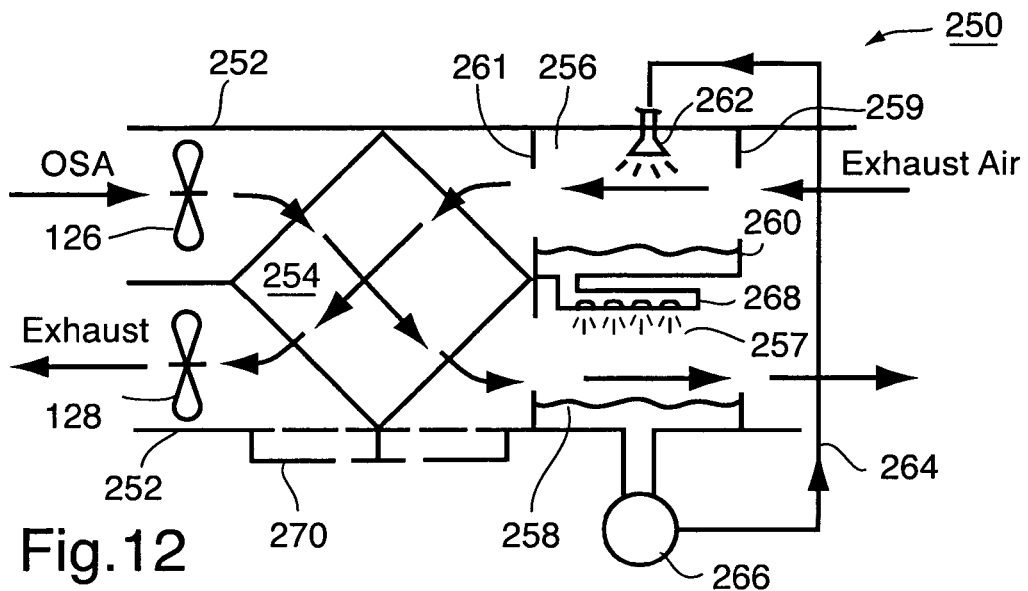

FIG. 12 is a schematic diagram of a ventilator 250 in which a liquid desiccant such as lithium bromide or the equivalent is used to reduce the humidity of the incoming outside air to further reduce the refrigeration load for the enclosed space. The ventilator 250 includes a housing 252, a heat exchanger 254, an inlet fresh air mover 126, an exhaust air mover 128, and a condensate drain 270.

Two chambers 256 and 257 are provided. The first chamber 256 is formed at the exhaust air inlet of the ventilator. The chamber 256 has side walls 261 and 259 with air flow openings. A spray nozzle structure 262 is provided to spray liquid desiccant into the chamber 256 supplied under pressure by a pump 266 through a line 264. The sprayed liquid contacts the exhaust air passing through the chamber 256 and then falls to the bottom of the chamber where it is collected as indicated at 260.

The liquid then flows, under the force of gravity, through an opening in the bottom of the chamber 256 to a nozzle structure 268 which sprays the desiccant liquid downwardly into the second chamber 257. In the chamber 257 the liquid desiccant contacts the outside air flowing through the chamber 257 to significantly reduce its humidity. The desiccant liquid then is collected at the bottom of the chamber 257 as indicated at 258, and is delivered to the pump 266 to recycle the liquid.

The spraying of the liquid into the exhaust air chamber 256 removes water vapor from the liquid and regenerates the desiccant liquid before it is sprayed into the humid outside air in chamber 257.

As a result, the outside air introduced by the ventilator has been both dried and cooled.

In cold weather, when the outside air temperature is lower than the exhaust air temperature, the ventilator system 250 reverses its operation and increases the humidity in the incoming outside air, as usually is desired in times of colder outside air temperatures. If neither humidification nor dehumidification of the outside air is desired, the liquid desiccant spray simply can be turned off.

Figure 14:
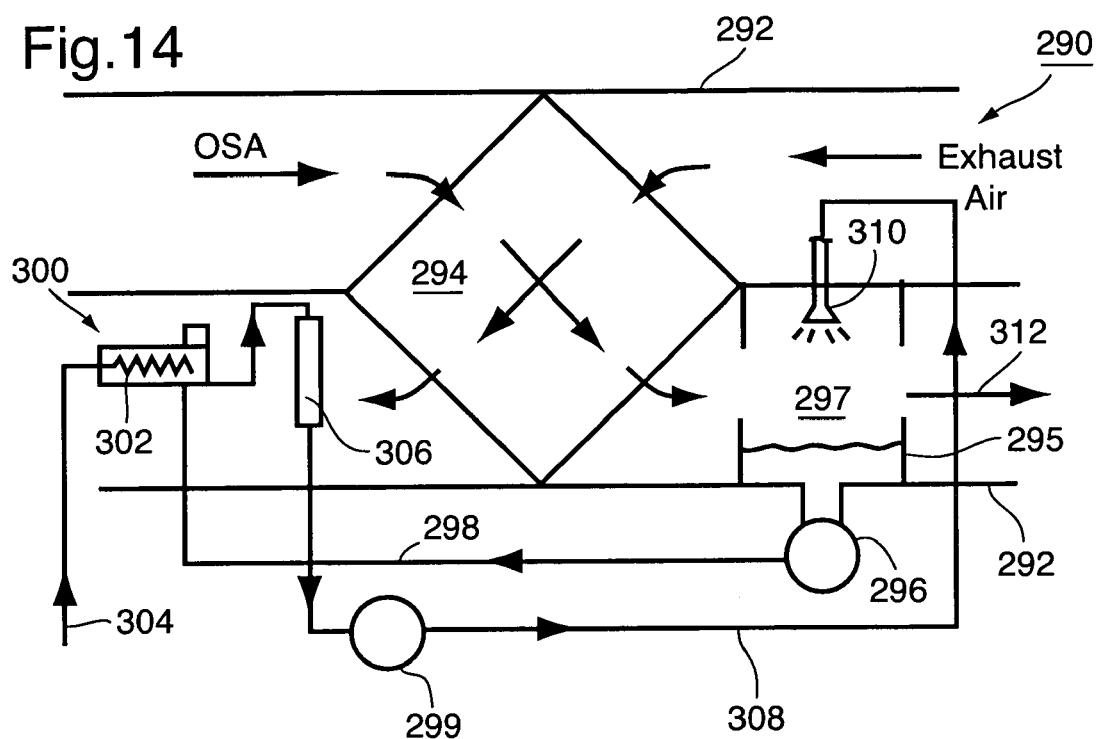

FIG. 14 shows another ventilating system 290 utilizing a liquid desiccant to dehumidify outside air. The ventilator 290 includes a housing 292, a heat exchanger 294 and a chamber 297 through which outside air from the heat exchanger 294 is passed.

The walls 295 of the chamber 297, like those of the chamber 257, have openings through which the outside air flows.

A spray device 310 sprays liquid desiccant into the chamber 297 where it contacts the outside air and dries it. The liquid collects in the bottom of the chamber 297 where it is pumped by means of a pump 296 to a collecting basin 300 where it is heated by means of an electrical resistance heating element 302 supplied with electrical power through a line 304. The liquid desiccant is heated to drive out the water and thus regenerate it. The heated, regenerated liquid is delivered to a radiator 306 which is contacted by the exhaust air emerging from the heat exchanger 294 to cool the liquid. The liquid then is pumped back to the spray device 310 by means of a pump 299.

Thus, in the ventilator 290, the exhaust air again is used to assist in regeneration of the desiccant liquid by cooling the liquid after it has been heated to regenerate it.

Variable Reheat Dehumidifying Ventilators

Figure 13:
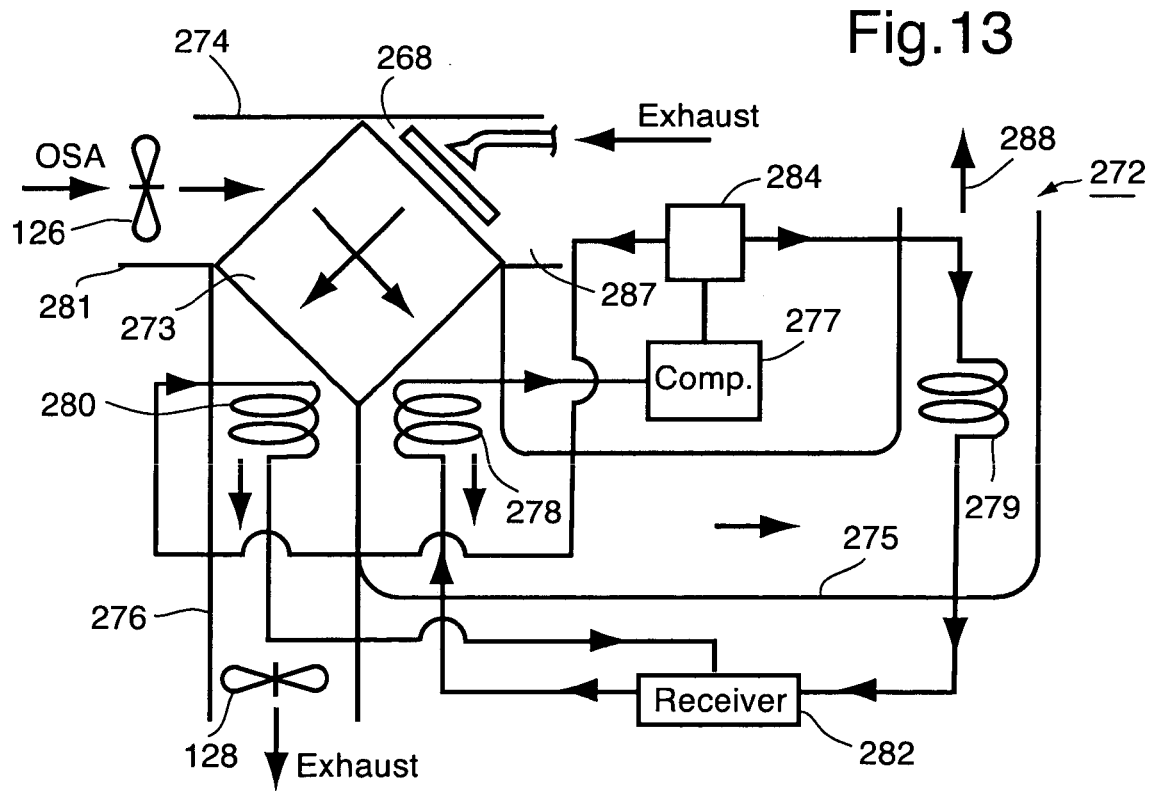

FIG. 13 shows a variable reheat dehumidifying ventilator system 272 which uses a refrigeration system to dehumidify incoming fresh air, and provides variable reheating of the fresh air to add a desired amount of heat to the fresh air.

The ventilator system 272 includes a housing 274 with an exhaust air inlet duct 287 and an exhaust air outlet duct 276 with an exhaust air handler 128 which pulls exhaust air through a heat exchanger 273.

The ventilator also includes a fresh air inlet duct 281 with a fresh air fan 126 which pushes fresh outside air through the heat exchanger 273 and into a u-shaped fresh air outlet duct 275 which delivers conditioned air to the enclosed space at 288.

The refrigeration system includes a compressor 277 for compressing gaseous refrigerant received from an evaporator 278 which is positioned in the outside air outlet conduit 275.

Compressed refrigerant gas is sent through a bi-directional valve 284 to either one or the other of two condensers 279 and 280, each of which delivers liquid refrigerant to a receiver 282 which delivers refrigerant to the evaporator 278.

One of the condensers 280 is located in the outlet conduit 276 from the heat exchanger 273 where it is cooled by exhaust air emerging from the heat exchanger 273. An optional evaporative cooling device 286 is provided for cooling the exhaust air before it enters the heat exchanger, as is explained in greater detail elsewhere herein.

The other condenser 279 is located in the fresh air outlet duct 275 following the evaporator 278.

The valve 284 is operated, preferably by means of a programmed microprocessor-based controller like that shown in FIG. 4, 9 or 10 so as to conduct hot gaseous refrigerant through the condenser 279 when it is desired to reheat the air cooled and dehumidified by the evaporator 278.

For some spaces being conditioned, such as indoor swimming pools and unoccupied auditoriums, the air tends to be very humid but cool. Therefore, cooling of the air is not needed and the dehumidified air can be reheated by the condenser 279 while the other condenser 280 is inactive.

Other spaces may require cooling as well as dehumidification. In this case, the condenser 280 receives gaseous refrigerant, and the valve 284 is operated so as to disable the condenser 279.

The amount of reheating of the dehumidified air which is provided can be varied between zero and the maximum available by modulating the operation of the valve 284 to enable the condensers 279 and 280 alternatingly for varying amounts of time. For example, in order to provide half of the maximum reheating available, the condenser 279 can be enabled for five minutes, and then the condenser 280 for five minutes, then the condenser 279 for another five minutes, etc. The ratio of on-times between the two condensers can be varied in order to further adjust the amount of reheating of the dehumidified outside air.

In some prior systems used with indoor swimming pools, which use a single condenser, the condenser sometimes is located so as to make contact with the swimming pool water so as to heat the water with waste heat. In the invention shown in FIG. 13, the condenser 280 can be positioned so that it is cooled by the swimming pool water rather than by the exhaust air from the heat exchanger 273.

The ventilator system 272 is highly advantageous in that it provides for initial cooling and dehumidification of outside air in the heat exchanger 273 and further reclaims energy from the exhaust air by using it to cool the condenser 280 at times when reheating of the dehumidified air is not needed.

The ventilator system 272 also is highly advantageous in that the outside air is precooled and partially dehumidified by the heat exchanger, thus reducing the amount of dehumidification and cooling which must be done by the refrigeration system and saving equipment cost.

Integrated Ventilators

FIG. 15 is a schematic diagram of a ventilator system 320 integrated with a central heating and air conditioning unit 322. The ventilator of FIG. 15 advantageously uses the air mover 330 of the central unit to supply exhaust air and to inject outside air into the air distribution system through which heated or cooled air normally is delivered to the enclosed space.

Such an enclosed space typically would be a single or multiple-family dwelling, or small or even larger commercial buildings utilizing similar heating and cooling systems, like that shown in FIG. 5 of the drawings, for example.

The central unit 322 includes an internal chamber 328, the fan 330, an air filter 329, the evaporator 332 of an air conditioning system whose compressor and condenser unit is shown at 336, and a gas or oil burner 334 for heating air to be delivered through the supply duct 324 and return duct 326 of the air distribution system for the building. Heating by means other than a fuel burner, such as by electric resistance heating, also can be used.

When cooling the enclosed space, the air conditioner operates and the evaporator 332 cools the air circulated through the air ducts.

When heating the enclosed space, the air conditioner is turned off, the burner 334 is fired, and heated air is delivered through the air ducts.

The ventilator unit 350 includes a heat exchanger 352, preferably made of plastic, in a housing which has an outside air inlet 354 and an outside air outlet 358, as well as an exhaust air inlet 360 and an exhaust air outlet 356. An optional evaporative cooler 357 is provided at the exhaust air inlet to the heat exchanger 350. A condensate and evaporative cooling water drain 362 also is provided.

A wall in the building in which the equipment is installed is shown schematically at 378. The wall, has an outside air inlet opening 370 and an exhaust air outlet opening 374, with an outside air inlet hood 372 and an exhaust air hood 376. Preferably, the openings 370 and 374 are spaced laterally or otherwise from one another so as to avoid reintroducing exhaust air into the outside air inlet.

A conduit 364, shown in dashed lines, is used to connect the outside air inlet 370 with the inlet 354 to the heat exchanger.

The outside air outlet 358 of the heat exchanger is connected by a conduit 346 to an inlet opening 340 in the return air duct 326.

Similarly, the exhaust outlet 356 of the heat exchanger 350 is connected by a conduit 368 to the exhaust outlet 374.

The exhaust air inlet 360 is connected by means of a conduit 348 to an outlet 338 in the supply duct 324. Preferably, the inlets and outlets 340 and 338 are positioned relatively near the central unit 322. The conduits 364, 368, 346 and 348 can be flexible conduits, if desired, or they can be permanent ductwork.

Although the provision of dampers is not necessary, as an option, a first damper 342 is positioned in the inlet 340 and a damper control mechanism $D_1$ is provided to control the damper.

Similarly, a second optional damper 344 is positioned in the outlet 338, and a second damper control mechanism $D_2$ is supplied to control that damper.

In accordance with the present invention, a minor proportion of the air delivered under positive pressure by the fan 330 to the supply duct 324 is extracted through the outlet 338 and delivered as exhaust air to the heat exchanger 352.

A similar minor proportion of the return air is supplied to by fresh air delivered through the inlet 340.

Preferably, the flows through the inlet 340 and outlet 338 are balanced with on another.

Secondly, the flows can be balanced by a mechanical flow balance in the heat exchanger, to be described below.

Third, where dampers are used, the dampers can be adjusted, either manually, or by electrical flow detectors and a controller to adjust the dampers.

The proportion of the air withdrawn from or added to the air flowing in the air ducts 324 and 326 should be selected so as not to materially reduce the normal heating and cooling capacity of the unit 322, while providing enough air to the heat exchanger to ensure an adequate amount of ventilation for the space being ventilated. The proportion of air can vary from about 5% to about 25%. A proportion around 10% is preferred.

The proportion can be set in several ways. It can be set by selection of the diameter of the inlet and outlet openings 338 and 340, or by adjustment of the dampers 342 and 344.

The system 320 shown in FIG. 15 operates as follows. The air delivered through outlet 338 usually is either heated or cooled by the central unit and filtered by a filter 329 by the fan 330 and delivered under positive pressure into the supply duct 324.

When the enclosed space is being cooled, cold air flows through the outlet 338 and into the heat exchanger 352 where it is brought into heat-exchange contact with warm outside air. Thus, the outside air is cooled significantly and delivered to the inlet 340 where it is mixed with the return air so as to supply cooled fresh air to the enclosed space.

In cold weather, when heating is required, hot air, under positive pressure, is delivered through the outlet 338 to the heat exchanger which then heats the outside air before delivering it to the return inlet 340.

When neither heating nor cooling is required and ventilation still is needed or desired, the fan 330 can be run to provide the desired ventilation.

When the outside air is hot and humid, the heat exchanger extracts a substantial amount of moisture from the outside air because of the relatively low temperature of the exhaust air passing through the heat exchanger. Furthermore, because the temperature difference between the outside air and the exhaust air is considerably greater than it would be otherwise, the heat transfer is more efficient, whether the control unit is in the heating or cooling mode. This allows the heat exchanger to be smaller and less costly than otherwise might be required.

Using greater temperature differentials in this manner increases the ratio of latent cooling to sensible cooling in the heat exchanger to more completely condition relatively humid outside air.

Since the unit 350 does not need its own fans, it can be made more compact and inexpensively, thus further reducing its cost.

The addition of evaporative cooling is believed to be beneficial in increasing the sensible cooling substantially, and latent cooling as well, by amounts substantially greater than the temperature drop created in the exhaust air would imply.

Although the system 320, in its simplest form, needs no controls, FIG. 17 is a schematic diagram of a microprocessor-based controller 394 which optionally can be used to control the operation of the dampers of the ventilator system. The controller 394 includes a central processing unit 396 which receives inputs from one or more of three input devices 398, 400 and 402 and delivers output signals to the two damper controls $D_1$ and $D_2$.

The first sensor 398 senses the outdoor temperature. This can be used to disable the ventilator system, if necessary, when the outdoor temperature either exceeds a preset value or drops below a second lower preset value. This is done in order to allow the heating and air conditioning system to supply all of its air for heating or air conditioning under extreme temperature circumstances. For example, on extremely hot days, all of the cold air in the air conditioning system may be required to be delivered to the enclosed space to keep it adequately cool. Similarly, during extremely cold weather, all of the air may be necessary to keep the enclosed space sufficiently warm.

Input device 400 represents electrical flow sensors and circuitry in the heat exchanger which produce a signal which is a function of the difference between the outside air flow and the exhaust air flow. This signal is used to adjust the dampers 342 and 344 to re-balance the air flow.

Device 402 is a proportion setting input control by means of which the dampers 342 and 344 can be adjusted to provide either more or less air flow to and from the heat exchanger 352 so as to provide more or less fresh air, as needed.

FIG. 16 is a schematic diagram of another heat exchanger 380, made in accordance with my above-identified co-pending U.S. patent application Ser. No. 09/829,772. This heat exchanger has a built-in mechanical flow balancer 392, an outside air inlet duct 384, an exhaust air outlet duct 382, an outside air outlet duct 386, and an exhaust air outlet duct 388. Although the heat-exchanger is illustrated as if it were horizontal, actually it is tilted up at an angle. A condensate drain 390 also is provided to catch the condensate draining from the left end of the filtered heat-exchanger.

The flow balancer 392 is one of several of a known construction. For example, both air streams can be made to impinge upon the blades of separate rotary paddle-wheel structures coupled to one another so that the rotation of the paddle-wheels meters the flow of both air columns.

As it is disclosed and explained in greater detail in my above-identified prior application Ser. No. 09/829,772, the heat exchanger 388 is made economically by heat-forming cavities in relatively thick thermo-plastic sheets made up of elongated parallel plastic tubes, interleaving the sheets with other thermo-plastic sheets having separate gas flow conduit structures, and securing the sheets together. The flow through the passages in the heat exchanger preferably are mostly opposed to one another, so as to give the heat exchanger the improved heat transfer efficiency of a counter-flow heat exchanger.

The heat exchanger also is notable in that the sides of the heat exchanger are integrally formed of the same plastic material as the flow passages so that a separate expensive sheet-metal housing is not needed.

The above description of the invention is intended to be illustrative and not limiting. Various changes or modifications in the embodiments described may occur to those skilled in the art. These can be made without departing from the spirit or scope of the invention.

In any patent granted for the subject matter herein, if there should be any embodiment or feature that is disclosed but not recited in any claim, there is no intention to abandon or dedicate that embodiment or feature to the public. Rather, the disclosure of that embodiment or feature is intended to illustrate one of the variations possible within the scope of the invention.

What is claimed is:

1. A ventilator device for selectively introducing outside air into and exhausting air from an enclosed space, said device comprising:
   a heat exchanger;
   an exhaust air conduit and a fresh air conduit for said heat exchanger;
   an exhaust air mover for moving exhaust air through said exhaust conduit and said heat exchanger;
   a fresh air mover for moving fresh air through said fresh air conduit and said heat exchanger;
   a programmed controller;
   said controller being programmed to direct said exhaust air and said outside air through said heat exchanger to exchange heat between said exhaust air and said outside air in a first mode of operation, and to switch, irrespective of the set or measured temperature of the enclosed space to a second mode of operation in which said exchange of heat is reduced or eliminated, in accordance with a profile, stored in memory, which is a function of the time-varying heating and cooling needs of said enclosed space, in which said profile includes a first outdoor air temperature below which said enclosed space needs heating and an instruction to switch between said modes when said temperature is reached, and including an outdoor air temperature sensor for delivering an outdoor temperature signal to said controller.

2. A device as in claim 1 in which said controller is programmed to reduce the speed of or stop said exhaust air mover during said second mode of operation.

3. A device as in claim 1 in which said outdoor air temperature in said profile is field-programmable.

4. A device as in claim 1 in which said profile includes an upper outdoor air temperature, and in which said controller switches from said second mode of operation to said first mode of operation at outdoor air temperatures above said upper outdoor air temperature.

5. A device as in claim 1 in which said profile includes a defrost mode set point, an outdoor air temperature sensor for delivering an outdoor air temperature signal to said controller, and including an instruction to slow or stop said fresh air handler periodically while operating said exhaust air handler, when outdoor air temperatures below said defrost mode set point are detected.

6. A device as in claim 1 in which said profile includes instructions for operating said ventilating system at various times in accordance with the expected occupancy of the enclosed space at those times.

7. A device as in claim 1 in which said profile contains information for a plurality of different times of operation, said times being selected from the group consisting of: night time; day time; when the building is occupied; when the building is partially occupied; when the building is substantially unoccupied; weekdays; holidays; and special occasions in which said information is determined by the building management computer system, and downloaded to said controller.

8. A device as in claim 1 including a building management system computer programmed to determine the heat balance of said enclosed space and deliver command signals to said ventilator to switch it from one of said modes to another.

9. A device as in claim 1 in which said heat exchanger is selected from the group consisting of one or more heat pipes; an all-plastic plate type heat exchanger with a separate housing;
   an all-plastic plate type heat exchanger with an integral plastic housing; and a thermal rotary heat exchanger rotatably mounted in a housing.

10. A device as in claim 1 including an evaporative cooling device for selectively cooling exhaust air before said exhaust air passes through said heat exchanger.

11. A device as in claim 10 in which said controller is programmed to start said evaporative cooling means upon the detection of a pre-determined outdoor temperature.

12. A ventilator device for selectively introducing outside air into and exhausting air from an enclosed space, said device comprising:
a heat exchanger;
an exhaust air conduit and a fresh air conduit for said heat exchanger;
an exhaust air mover for moving exhaust air through said exhaust conduit and said heat exchanger;
a fresh air mover for moving fresh air through said fresh air conduit and said heat exchanger;
a programmed controller;
said controller being programmed to direct said exhaust air and said outside air through said heat exchanger to exchange heat between said exhaust air and said outside air in a first mode of operation, and to switch to a second mode of operation in which said exchange of heat is reduced or eliminated, in accordance with a profile, stored in memory, which is a function of the time-varying heating and cooling needs of said enclosed space in which said profile includes a defrost mode set point, a heating mode set point, and a cooling mode set point, each of said set points being field programmable, and a default value for each of said set points.

13. A device as in claim 12 in which said defrost mode set point default value is around 24° F.; said heating mode set-point default value is around 52° F.; and said cooling mode set point default value is around 65° F. to 70° F.

* * * * *